(12) United States Patent
Feng et al.

(10) Patent No.: US 8,232,831 B2
(45) Date of Patent: Jul. 31, 2012

(54) MULTIPLE INPUT/GAIN STAGE GILBERT CELL MIXERS

(75) Inventors: Jeffrey T. Feng, Cambridge, MA (US); Richard T. Chan, Merrimack, NM (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/625,097

(22) Filed: Nov. 24, 2009

(65) Prior Publication Data
US 2011/0121881 A1    May 26, 2011

(51) Int. Cl.
*G06G 7/16* (2006.01)
(52) U.S. Cl. .................... 327/357; 327/359; 455/323
(58) Field of Classification Search .......... 327/355–361; 455/326, 333, 323
See application file for complete search history.

(56) References Cited

U.S. PATENT DOCUMENTS

| | | | |
|---|---|---|---|
| 3,689,752 A | | 9/1972 | Gilbert |
| 5,115,409 A | | 5/1992 | Stepp |
| 5,381,127 A | * | 1/1995 | Khieu ........................ 340/146.2 |
| 6,330,274 B1 | * | 12/2001 | Uehara ......................... 375/150 |
| 6,590,438 B1 | * | 7/2003 | Manku et al. ................. 327/359 |
| 6,917,788 B2 | * | 7/2005 | Malhi et al. ...................... 455/76 |
| 7,164,897 B2 | * | 1/2007 | Manku et al. ................. 455/293 |
| 7,348,855 B2 | * | 3/2008 | Wu .................................. 330/296 |
| 7,366,484 B2 | * | 4/2008 | Sowlati ...................... 455/127.2 |
| 7,542,812 B2 | | 6/2009 | Stroili et al. |
| 2010/0141325 A1 | * | 6/2010 | Bao et al. ....................... 327/355 |

OTHER PUBLICATIONS

Gilbert, "A Precise Four-Quadrant Multiplier with Subnanosecond Response", IEEE Journal of Solid-State Circuits, vol. sc-3, No. 4, Dec. 1968.

* cited by examiner

*Primary Examiner* — Dinh T. Le
(74) *Attorney, Agent, or Firm* — Finch & Maloney PLLC; Neil F. Maloney

(57) ABSTRACT

Multiple input and/or gain stage Gilbert cell mixer designs are disclosed. The designs allow one input to be turned on at a time, and are suitable, for example, for use in receiver and transmitter applications. In addition, the designs allow for the inputs of the multi-input Gilbert cell mixer to be connected together, thereby allowing for switching of gain states within the Gilbert cell mixer. The mixer design may include, for example, a Gilbert cell mixer stage, and a plurality of input/gain stages. Each input/gain stage has its output connected to the input of the mixer stage, and is configured for receiving an input signal and applying a gain factor to that input signal to provide a signal for mixing with the LO. Each input/gain stage is configured with stage select circuitry for enabling or disabling that stage, so that only one input/gain stage is active at a time.

22 Claims, 6 Drawing Sheets

MULTIPLE INPUT/GAIN STAGE GILBERT CELL MIXERS

STATEMENT OF GOVERNMENT INTEREST

The invention was made with United States Government support under contract N00014-04-C-0589 awarded by the Army, and the United States Government has certain rights in this invention.

FIELD OF THE INVENTION

The invention relates to integrated circuitry, and more particularly, to Gilbert cell multiplier circuits.

BACKGROUND OF THE INVENTION

A so-called Gilbert cell or four-quadrant multiplier is a cross-coupled differential amplifier having a gain that can be linearly controlled by modulating emitter bias current or by adjusting the ratio of emitter degeneration resistance to the load resistance. The amplitude of the differential input RF signal can be linearly controlled by a differential AC voltage. Typical Gilbert cell configurations can be found, for example, in U.S. Pat. No. 3,689,752.

Gilbert cells are commonly used in a number of applications, including mixers, automatic gain control (AGC) amplifiers, amplitude and sideband modulators, amplitude modulation (AM) and sideband detectors, frequency doublers and dividers, squaring and square-root circuits. The typical implementation of a Gilbert cell mixer utilizes a simple differential pair as the input transconductance stage. This is cascode connected with the Gilbert switching quad, which is typically driven by a local oscillator signal. The resulting mixer can then be used to down-convert RF signals to some intermediate frequency (IF) in receiver applications, or to up-convert IF signals to the RF transmission band in transmitter applications.

Wideband receivers and transmitters often require multiple paths between the input and output because frequency-selective filters, often times in parallel, are used to cover different frequency bands and prevent signals at non-desirable frequencies from aliasing into the frequency band of interest at the output. Consequently, a M:1 switch is usually required in the system, either on the input of the mixer where M RF input signal paths are switched into a single mixer, or on the mixer output where the outputs from M mixers are switched to a signal IF output path. In addition, receivers and transmitters requiring multiple gain states require an additional variable gain amplifier or attenuator block to adjust the gain of the receiver, either at the input of the Gilbert cell mixer (in the RF band) or at the output of the Gilbert cell mixer (in the IF band).

However, cascading external switching and gain blocks (such as M:1 switches, amplifier, and attenuator blocks) in receivers and transmitters generally decreases system performance, including increased noise figure and decreased output intercept point (linearity). In addition, although some Gilbert cell multiplier circuits are themselves configured to receive multiple inputs, such conventional configurations necessitate multiplication of all the inputs at once, which is not suitable for all applications, such as those where only one of multiple inputs is desired for multiplication.

SUMMARY OF THE INVENTION

One embodiment of the present invention provides a mixer circuit device. The device includes a Gilbert cell mixer stage for multiplying a first signal received at an input by a second signal to provide an output signal. The device further includes a plurality of input/gain stages, each input/gain stage having its output connected to the input of the mixer stage and for receiving an input signal and applying a gain factor to that input signal to provide the first signal, wherein each input/gain stage is configured with stage select circuitry for enabling or disabling that stage, so that only one input/gain stage is active at a time. In one particular case, each of the input/gain stages is configured with emitter degeneration. In another particular case, each of the input/gain stages includes a differential pair that is biased using the stage select circuitry. In another particular case, the stage select circuitry includes a current source. In one such case, each of the current sources is implemented as a current minor with emitter degeneration. In another particular case, each input/gain stage receives a corresponding one of multiple input signals, and only one of the input/gain stages is enabled at a time. In another particular case, the input/gain stages are tied together so that each input/gain stage receives a common input signal, and only one of the input/gain stages is enabled at a time. In one such case, each of the input/gain stages has a different gain. In another particular case, the device is included in a system-on-chip configuration.

Another embodiment of the present invention provides an integrated circuit. The integrated circuit includes a Gilbert cell mixer stage for multiplying a first signal received at an input by a second signal to provide an output signal. The integrated circuit further includes a plurality of input/gain stages, each input/gain stage having its output connected to the input of the mixer stage and for receiving an input signal and applying a gain factor to that input signal to provide the first signal, wherein each input/gain stage is configured with stage select circuitry for enabling or disabling that stage, so that only one input/gain stage is active at a time. Each of the input/gain stages further includes a differential pair that is biased using the stage select circuitry, and the stage select circuitry includes two current sources. In one particular case, each of the input/gain stages is configured with emitter degeneration, and each of the current sources is implemented as a current mirror with emitter degeneration. In another particular case, at least one of the input/gain stages includes a complementary metal oxide differential pair of field-effect transistors or a heterojunction bipolar transistor differential pair or a bipolar junction transistor differential pair. In another particular case, each input/gain stage receives a corresponding one of multiple input signals, and only one of the input/gain stages is enabled at a time. In another particular case, inputs of the input/gain stages are tied together so that each input/gain stage receives a common input signal, and only one of the input/gain stages is enabled at a time. In one such case, each of the input/gain stages has a different gain.

Another embodiment of the present invention provides a system that includes a circuit for at least one of transmitting and/or receiving communication signals, the circuit including a mixer device. The mixer device includes a Gilbert cell mixer stage for multiplying a first signal received at an input by a second signal to provide an output signal, and a plurality of input/gain stages, each input/gain stage having its output connected to the input of the mixer stage and for receiving an input signal and applying a gain factor to that input signal to provide the first signal. Each input/gain stage is configured with stage select circuitry for enabling or disabling that stage, so that only one input/gain stage is active at a time. Each of the input/gain stages further includes a differential pair that is biased using the stage select circuitry, and the stage select circuitry includes a current source. In one particular case, each of the input/gain stages is configured with emitter degeneration, and each of the current sources is implemented as a current minor with emitter degeneration. In another particular case, each input/gain stage receives a corresponding one of multiple input signals, and only one of the input/gain stages is enabled at a time. In another particular case, inputs of the input/gain stages are tied together so that each input/gain stage receives a common input signal, and only one of the input/gain stages is enabled at a time. In one such case, each of the input/gain stages has a different gain.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1A:
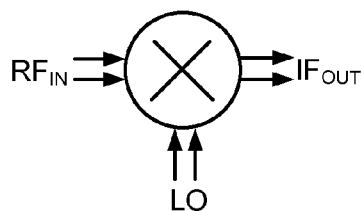
FIGS. 1a-b illustrate a typical Gilbert cell mixer circuit.

Multiple input and/or gain stage Gilbert cell mixer designs are disclosed. The designs allow one input to be turned on at a time, and are suitable, for example, for use in receiver and transmitter applications. In addition, the designs allow for the inputs of the multi-input Gilbert cell mixer to be connected together, thereby allowing for switching of gain states within the Gilbert cell mixer.

General Overview

As previously explained, conventional techiques for addressing multi-path receiver and transmitter configurations generally involves cascading an M:1 switch either at the input or output of the mixer. Likewise, conventional techniques for addressing multiple gain state transmitter configurations generally involves cascading a variable gain stage either at the input or output of the mixer. While the cascading of such discrete switching and gain stages is acceptable in many applications, the degradation to the linearity and noise figure of the system may create problems in others.

Thus, and in accordance with an embodiment of the present invention, a multi-input Gilbert cell mixer is provided for use in receivers and transmitters, thereby eliminating the need for a cascaded M:1 switch. The mixer design provides reasonable isolation between the unselected inputs and the outputs of the system, so that individual inputs of a multi-input set can be selected for mixing. The mixer gain associated with any one selected input can be varied as well, if so desired. In addition, the multi-input Gilbert cell mixer can be configured with its inputs connected together, thereby allowing for switching of gain states within the Gilbert cell mixer and eliminating the need for a cascaded variable gain amplifier in the system.

In one example configuration, a multi-input Gilbert cell mixer configured in accordance with an embodiment of the present invention has the functionality of a Gilbert cell mixer, and further includes the functionality of an M:1 switch (allowing for switching of individual inputs) but without any performance degradation in linearity and noise figure associated with conventional configurations. In one specific such embodiment, two or more differential transconductance pairs with emitter degeneration are integrally cascaded by a four-quadrant multiplier circuit. Each differential pair can be selectively biased, such that a single one of the differential pairs is biased on. In addition, the bias of that selected differential pair can be varied within an active region to effectively provide variable gain, if so desired.

In another example configuration, a switched-gain Gilbert cell mixer configured in accordance with an embodiment of the present invention has the functionality of a Gilbert cell mixer, and is further capable of adjusting gain states without an additional circuit block in the receiver/transmitter cascade and without any performance degradation in linearity and noise figure. In one specific such embodiment, two or more differential transconductance pairs with emitter or source degenerations have their corresponding inputs tied together to form a single differential input. The outputs of the differential pairs are connected together and are cascaded by a single four-quadrant multiplier circuit. Each differential pair can be selectively biased, such that a single one of the differential pairs is biased on, and each of the differential pairs can be further configured with a different small-signal transconductance. Thus, the overall gain of the switched-gain Gilbert cell mixer can be determined by which differential pair is biased on.

Such Gilbert cell mixer configurations have a number of advantages, such as providing the flexibility to reduce layout parasitics for simultaneous high speed, wideband, and high dynamic range applications. As will be apparent in light of this disclosure, the mixer devices provided herein can be implemented in various configurations, such as with bipolar junction transistor (BJT), heterojunction bipolar transistor (HBT), and/or complementary metal oxide semiconductor (CMOS) technologies, and are suitable for any number of applications, including integrated system-on-chip configurations as well as printed circuit boards configured with various discrete components including multi-input mixers (e.g., RF receivers and transmitters, especially those suitable for wideband applications). Numerous other applications will be apparent in light of this disclosure.

Gilbert Cell Mixer Architecture

Figure 1B:
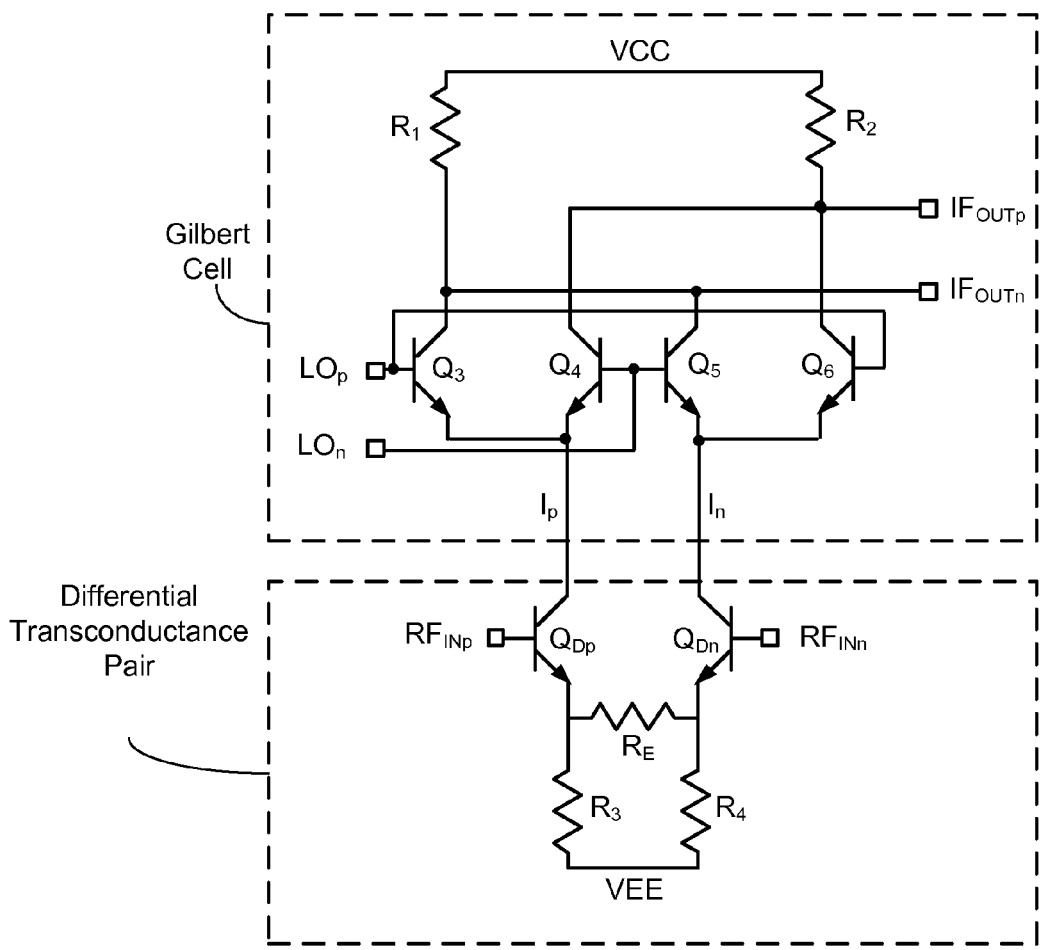

FIGS. 1a-b illustrate a typical Gilbert cell mixer. In operation, and with reference to FIG. 1a, the mixer circuit is configured to receive a differential input signal ($RF_{IN}$), which is mixed with a differential local oscillator signal (LO) to provide a differential output signal ($IF_{OUT}$).

As can be seen with reference to FIG. 1b, the mixer circuit includes a differential transconductance amplifier stage (differential transconductance pair) operatively coupled to a mixing stage implemented with a Gilbert cell. The power supplies of $V_{CC}$ and $V_{EE}$ are provided as typically done.

In such a typical Gilbert cell mixer, the RF input stage to the mixer has a differential transconductance pair of transistors, $Q_{Dp}$ and $Q_{Dn}$. This transistor pair converts a differential input voltage at the bases to an output current at the collectors. The differential input voltage is designated as $RF_{INp}$ and $RF_{INn}$, and the differential output current is designated as $I_p$ and $I_n$.

The differential output current $I_p$ and $I_n$ is then mixed with the local oscillator signal ($LO_p$ and $LO_n$) applied to the Gilbert switching quad, which is made up of $Q_3$-$Q_6$. The differential output signal of the mixing stage ($IF_{OUTp}$ and $IF_{OUTn}$) is taken at the collectors of the Gilbert quad.

Linearity is generally dependent on the semiconductor process used and how much emitter degeneration is used, which is impedance element $R_E$. When impedance $R_E$ is a resistive element (as shown in FIG. 1b) for broadband applications, high linearity can be achieved. Note, however, that there is a trade with respect to lower mixer circuit gain and higher noise figure. Narrow band applications can partially mitigate this shortcoming by utilizing reactive components (i.e., inductors and/or capacitors) for impedance $R_E$. The other impedances $R_1$-$R_4$ are generally used for shaping the circuitry frequency response and gain. Typical impedance values are as follows: $R_1$=$R_2$=100 ohms; $R_3$=$R_4$=70 ohms; and $R_E$=45 ohms.

While this typical mixer configuration can be cascaded with external switching and/or gain stages as previously described, there is a resultant performance degradation with respect to linearity and noise figure. Thus, and in accordance with an embodiment of the present invention, a multi-input Gilbert cell mixer is provided that has the functionality of a Gilbert cell mixer and a M:1 switch and/or variable gain stages integrated therein, but without any performance degradation in linearity and noise figure associated with such conventional configurations.

Multi-Input Gilbert Cell Mixer Architecture

Figures 2A, 2B:
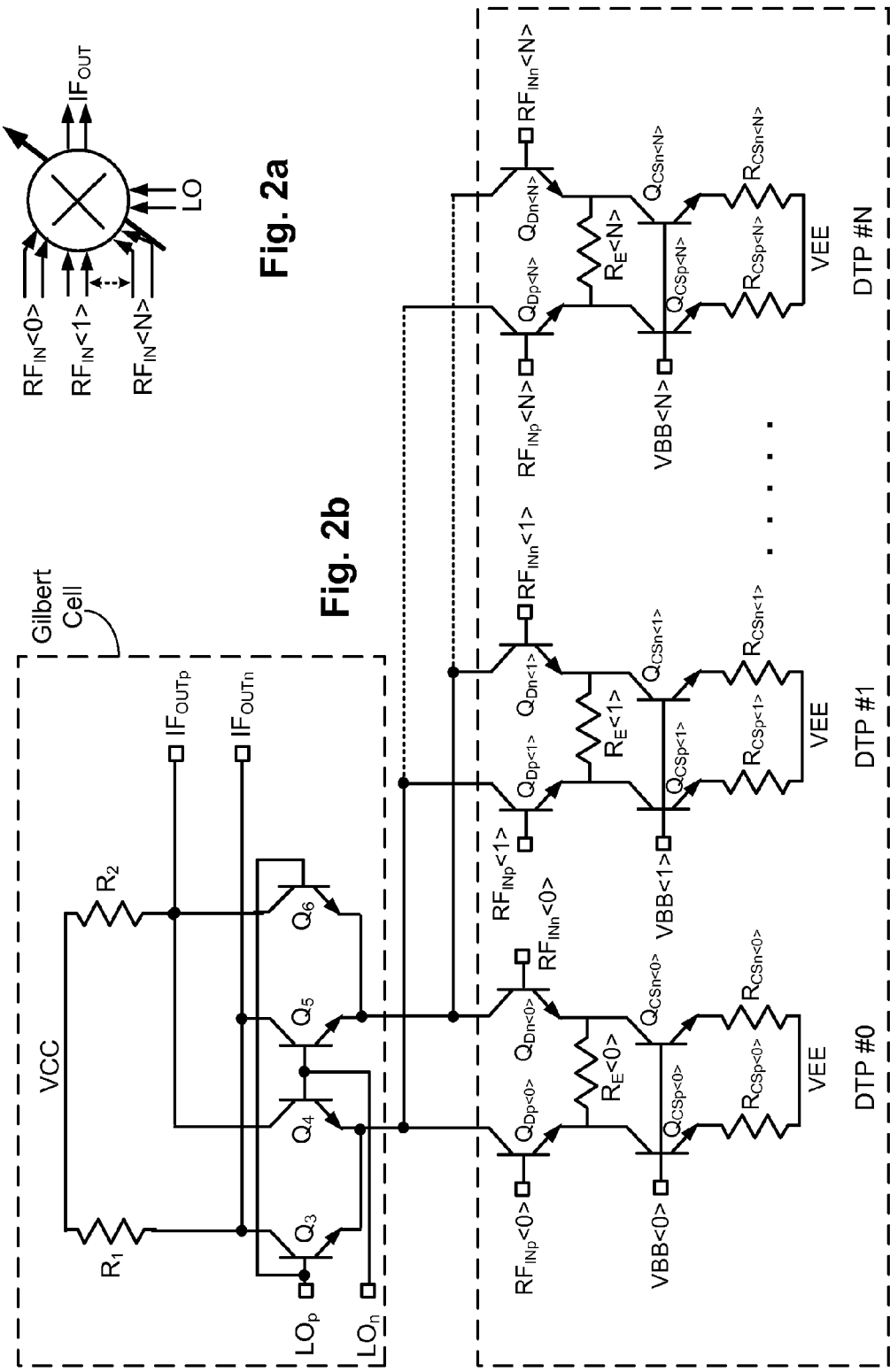
FIGS. 2a-b illustrate a variable gain multi-input Gilbert cell mixer circuit configured in accordance with an embodiment of the present invention.

FIGS. 2a-b illustrates a variable gain multi-input Gilbert cell mixer circuit configured in accordance with an embodiment of the present invention. As can be seen with reference to FIG. 2a, the mixer circuit receives multiple differential input signals ($RF_{IN<0>}$, $RF_{IN<1>}$, ..., $RF_{IN<N>}$), one of which is selected to be mixed with a differential local oscillator signal (LO) to provide a differential output signal ($IF_{OUT}$). In addition, the mixer circuit can provide a variable gain, generally designated in FIG. 2a as a slanted arrow running through the mixer.

As can be seen in FIG. 2b, the mixer stage is implemented with a Gilbert cell in a similar fashion as shown in FIG. 1b, and that previous description is equally applicable here. However, the single differential transconductance stage is replaced with N+1 RF input stages (generally designated as DTP #0, DTP #1, ..., DTP #N), each configured with stage select circuitry thereby providing an integrated multi-input Gilbert cell mixer circuit capable of having a single one of its multiple inputs selected for mixing with a local oscillator signal. This input selection function is achieved without any performance degradation in linearity and noise figure.

In more detail, each of the RF input stages is configured with emitter degeneration and are cascaded by the Gilbert cell, which as previously explained is a four-quadrant multiplier circuit. In this example embodiment, each differential pair can be biased using two current sources (one for the p-differential signal and the other for the n-differential signal). The current sources can be implemented, for example, as current mirrors with emitter degeneration, although other suitable current source configurations can be used as well. As will be appreciated in light of this disclosure, these differential current source pairs effectively provide a selection mechanism, thereby allowing multiple inputs of the mixer circuit to be individually selected for mixing.

The RF input stage DTP #0 includes a differential transconductance pair of transistors, $Q_{Dp<0>}$ and $Q_{Dn<0>}$, and is configured to receive a differential input voltage designated as $RF_{INp<0>}$ and $RF_{INn<0>}$. This transistor pair $Q_{Dp<0>}$ and $Q_{Dn<0>}$ converts the differential input voltage at its bases to an output current at its collectors. In operation, the differential pair $Q_{Dp<0>}$ and $Q_{Dn<0>}$ is turned on by raising or otherwise adjusting VBB<0> up to a proper voltage. When VBB<0> is applied, the combination of transistor $Q_{CSp<0>}$ and resistor $R_{CSp<0>}$ as well as transistor $Q_{CSn<0>}$ and resistor $R_{CSn<0>}$ sources a current that biases $Q_{Dp<0>}$ and $Q_{Dpn<0>}$ into the linear active region. As will be appreciated, VBB<0> can be adjusted to achieve a desired gain within that active region. If VBB<0> is too low, then the RF input stage DTP #0 will turn off; if VBB<0> is too high, then the RF input stage DTP #0 will saturate; thus, the active region is between these two extremes. The gain of RF input stage DTP #0 may also be adjusted, for example, by adjusting the degeneration impedance, $R_E<0>$.

The RF input stage DTP #1 includes a differential transconductance pair of transistors, $Q_{Dp<1>}$ and $Q_{Dn<1>}$, and is configured to receive a differential input voltage designated as $RF_{INp<1>}$ and $RF_{INn<1>}$. This transistor pair $Q_{Dp<1>}$ and $Q_{Dn<1>}$ converts the differential input voltage at its bases to an output current at its collectors. In operation, the differential pair $Q_{Dp<1>}$ and $Q_{Dn<1>}$ is turned on by raising or otherwise adjusting VBB<1> up to a proper voltage. When VBB<1> is applied, the combination of transistor $Q_{CSp<1>}$ and resistor $R_{CSp<1>}$ as well as transistor $Q_{CSn<1>}$ and resistor $R_{CSn<1>}$ sources a current that biases $Q_{Dp<1>}$ and $Q_{Dn<1>}$ into the active region. As will be appreciated, VBB<1> can be adjusted to achieve a desired gain within that active region. If VBB<1> is too low, then the RF input stage DTP #1 will turn off; if VBB<1> is too high, then the RF input stage DTP #1 will saturate; thus, the active region is between these two extremes. The gain of RF input stage DTP #1 may also be adjusted, for example, by adjusting the degeneration impedance, $R_E<1>$.

The RF input stage DTP #N includes a differential transconductance pair of transistors, $Q_{Dp<N>}$ and $Q_{Dn<N>}$, and is configured to receive a differential input voltage designated as $RF_{INp<N>}$ and $RF_{INn<N>}$. This transistor pair $Q_{Dp<N>}$ and $Q_{Dn<N>}$ converts the differential input voltage at its bases to an output current at its collectors. In operation, the differential pair $Q_{Dp<N>}$ and $Q_{Dn<N>}$ is turned on by raising or otherwise adjusting VBB<N> up to a proper voltage. When VBB<N> is applied, the combination of transistor $Q_{CSp<N>}$ and resistor $R_{CSp<N>}$ as well as transistor $Q_{CSn<N>}$ and resistor $R_{CSn<N>}$ sources a current that biases $Q_{Dp<N>}$ and $Q_{Dn<N>}$ into the active region. As will be appreciated, VBB<N> can be adjusted to achieve a desired gain within that active region. If VBB<N> is too low, then the RF input stage DTP #N will turn off; if VBB<N> is too high, then the RF input stage DTP #N will saturate; thus, the active region is between these two extremes. The gain of RF input stage DTP #N may also be adjusted, for example, by adjusting the degeneration impedance, $R_E<N>$.

Thus, in such a multi-input mixer circuit operation, only one of the differential transconductance pair of transistors $Q_{Dp<n>}$ and $Q_{Dn<n>}$ is biased on (e.g., somewhere in the linear or otherwise active region of the differential pair) at a time by applying the appropriate voltage VBB<n> to the corresponding selection circuitry (to the base terminals of transistors $Q_{CSp<n>}$ and $Q_{CSn<n>}$, in this example), VBB<n>. The gain of RF input stage DTP #n can be adjusted by adjusting VBB<n> within the linear or otherwise active region of the differential pair, and may also be adjusted, for example, by adjusting the degeneration impedance, $R_E<n>$. Note that n can be any integer from 0 to N, and represents one of N+1 RF input signals. In accordance with one embodiment of the present invention, providing multi-input stage functionality incurs a 10% (or lower) increase in intermodulation product (linearity) or noise figure degradation, relative to conventional single input stage configurations.

Switched-Gain Gilbert Cell Mixer Architecture

Figure 3A:
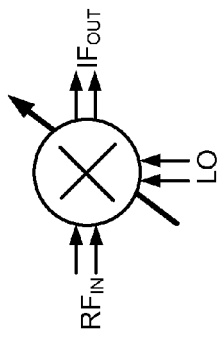
FIGS. 3a-b illustrate a switched gain Gilbert cell mixer circuit configured in accordance with an embodiment of the present invention.
Figure 3B:
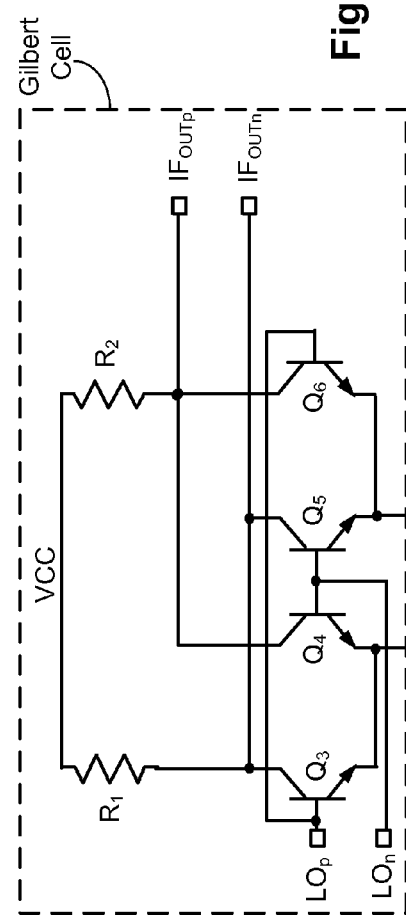
Figure 3B:
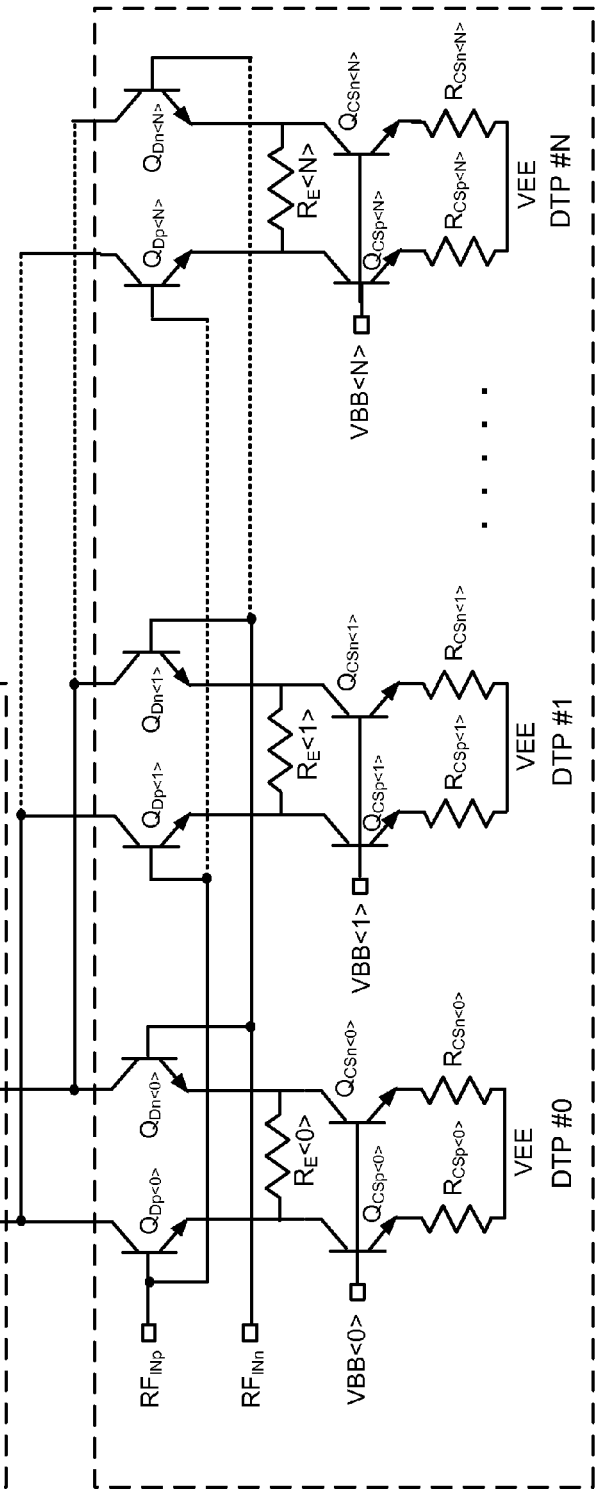

FIGS. 3a-b illustrates a switched gain Gilbert cell mixer circuit configured in accordance with an embodiment of the present invention. As can be seen with reference to FIG. 3a, the mixer circuit receives a single differential input signal ($RF_{IN}$), which is to be mixed with a differential local oscillator signal (LO) to provide a differential output signal $IF_{OUT}$). In addition, the mixer circuit can provide a variable gain, generally designated in FIG. 3a as a slanted arrow running through the mixer.

As can be seen in FIG. 3b, the mixer stage is implemented with a Gilbert cell in a similar fashion as shown in FIG. 1b, and that previous description is equally applicable here. However, the single differential transconductance stage is replaced with N+1 RF gain stages (generally designated as DTP #0, DTP #1, . . . , DTP #N), each configured with stage select circuitry thereby providing an integrated single-input Gilbert cell mixer circuit capable of providing multiple gain states. As previously explained, this adjustable gain state function is achieved without any performance degradation in linearity and noise figure typically associated with cascading a gain stage before or after the mixer circuit as conventionally done.

In more detail, the differential inputs of each gain stage are tied together to form a single differential input ($RF_{INn}$ and $RF_{INp}$), and the outputs of each gain stage are connected together and are cascaded by the single four-quadrant multiplier circuit (i.e., the Gilbert cell, in this example case). In this example embodiment, each differential pair can be biased using two current sources (one for the p-differential signal and the other for the n-differential signal). The current sources can be implemented, for example, as current minors with emitter degeneration, although other suitable current source configurations can be used as well. As will be appreciated in light of this disclosure, these differential current source pairs effectively provide a selection mechanism, thereby allowing multiple gain stages of the mixer circuit to be individually selected for amplifying (or attenuating) the RF input signal.

The RF gain stage DTP #0 includes a differential transconductance pair of transistors, $Q_{Dp<0>}$ and $Q_{Dn<0>}$, and is configured to receive a differential input voltage designated as $RF_{INp}$ and $RF_{INp}$. When this gain stage DTP #0 is selected, this transistor pair $Q_{Dp<0>}$ and $Q_{Dn<0>}$ converts the differential input voltage at its bases to an output current at its collectors. In operation, the differential pair $Q_{Dp<0>}$ and $Q_{Dn<0>}$ is turned on (effectively selecting that gain stage) by raising or otherwise adjusting VBB<0> up to a proper voltage. When VBB<0> is applied, the combination of transistor $Q_{CSp<0>}$ and resistor $R_{CSp<0>}$ as well as transistor $Q_{CSn<0>}$ and resistor $R_{CSn<0>}$ sources a current that biases $Q_{Dp<0>}$ and $Q_{Dn<0>}$ into the linear active region. As will be appreciated, VBB<0> can be adjusted to achieve a desired gain within that active region. If VBB<0> is too low, then the RF gain stage DTP #0 will turn off; if VBB<0> is too high, then the RF gain stage DTP #0 will saturate; thus, the active region is between these two extremes. The gain of RF gain stage DTP #0 may also be adjusted, for example, by adjusting the degeneration impedance, $R_E<0>$.

The RF gain stage DTP #1 includes a differential transconductance pair of transistors, $Q_{Dp<1>}$ and $Q_{Dn<1>}$, and is configured to receive the same differential input voltage as received by gain stage DTP #0 (i.e., $RF_{INp}$ and $RF_{INn}$). When gain stage DTP #1 is selected, this transistor pair $Q_{Dp<1>}$ and $Q_{Dn<1>}$ converts the differential input voltage at its bases to an output current at its collectors. In operation, the differential pair $Q_{Dp<1>}$ and $Q_{Dn<1>}$ is turned on (effectively selecting that gain stage) by raising or otherwise adjusting VBB<1> up to a proper voltage. When VBB<1> is applied, the combination of transistor $Q_{CSp<1>}$ and resistor $R_{CSp<1>}$ as well as transistor $Q_{CSn<1>}$ and resistor $R_{CSn<1>}$ sources a current that biases $Q_{Dp<1>}$ and $Q_{Dn<1>}$ into the linear active region. As will be appreciated, VBB<1> can be adjusted to achieve a desired gain within that active region. If VBB<1> is too low, then the RF gain stage DTP #1 will turn off; if VBB<1> is too high, then the RF gain stage DTP #1 will saturate; thus, the active region is between these two extremes. The gain of RF gain stage DTP #1 may also be adjusted, for example, by adjusting the degeneration impedance, $R_E<1>$.

The RF gain stage DTP #N includes a differential transconductance pair of transistors, $Q_{Dp<N>}$ and $Q_{Dn<N>}$, and is configured to receive the same differential input voltage as received by gain stages DTP #0 and DTP #1 (i.e., $RF_{INp}$ and $RF_{INn}$). When gain stage DTP #N is selected, this transistor pair $Q_{Dp<N>}$ and $Q_{Dn<N>}$ converts the differential input voltage at its bases to an output current at its collectors. In operation, the differential pair $Q_{Dp<N>}$ and $Q_{Dn<N>}$ is turned on (effectively selecting that gain stage) by raising or otherwise adjusting VBB<N> up to a proper voltage. When VBB<N> is applied, the combination of transistor $Q_{CSp<N>}$ and resistor $R_{CSp<N>}$ as well as transistor $Q_{CSn<N>}$ and resistor $R_{CSn<N>}$ sources a current that biases $Q_{Dp<N>}$ and $Q_{Dn<N>}$ into the linear active region. As will be appreciated, VBB<N> can be adjusted to achieve a desired gain within that active region. If VBB<N> is too low, then the RF gain stage DTP #N will turn off; if VBB<N> is too high, then the RF gain stage DTP #N will saturate; thus, the active region is between these two extremes. The gain of RF gain stage DTP #N may also be adjusted, for example, by adjusting the degeneration impedance, $R_E<N>$.

Thus, in such a multi-gain stage mixer circuit operation, only one of the differential transconductance pair of transistors $Q_{Dp<n>}$ and $Q_{Dn<n>}$ is biased on (e.g., somewhere in the linear or otherwise active region of the differential pair) at a time by applying the appropriate voltage VBB<n> to the corresponding selection circuitry (to the base terminals of transistors $Q_{CSp<n>}$ and $Q_{CSn<n>}$, in this example), VBB<n>. The gain of RF gain stage DTP #n can be adjusted by adjusting VBB<n> within the linear or otherwise active region of the differential pair, and may also be adjusted, for example, by adjusting the degeneration impedance, $R_E<n>$. Note that n can be any integer from 0 to N, and represents one of N+1 RF gain stages. In accordance with one example embodiment, each of the differential pairs is configured with a different small-signal transconductance (to provide a different gain), and the overall gain of the switched-gain Gilbert cell mixer is determined by which differential pair is biased on.

As will be appreciated in light of this disclosure, gain adjustments can be made in a number of ways, including adjusting the emitter degeneration resistance and/or the transistor device sizes within each differential pair and/or by biasing a differential pair in the active region at a time. Any one or combination of these can be used to provide a mixer with variable gain control.

Allowing for low impedance current switching (as opposed to voltage switching) allows multiple inputs to be combined into a single node with little or no significant intermodulation product or noise figure degradation. For instance, in one example embodiment, providing multi-gain stage functionality incurs a 10% (or lower) increase in intermodulation product (linearity) or noise figure degradation, relative to conventional single gain stage configurations.

Figure 4A:
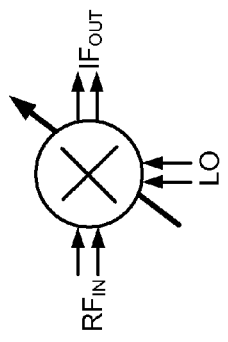
FIGS. 4a-b illustrate a switched gain Gilbert cell mixer circuit configured in accordance with another embodiment of the present invention.
Figure 4B:
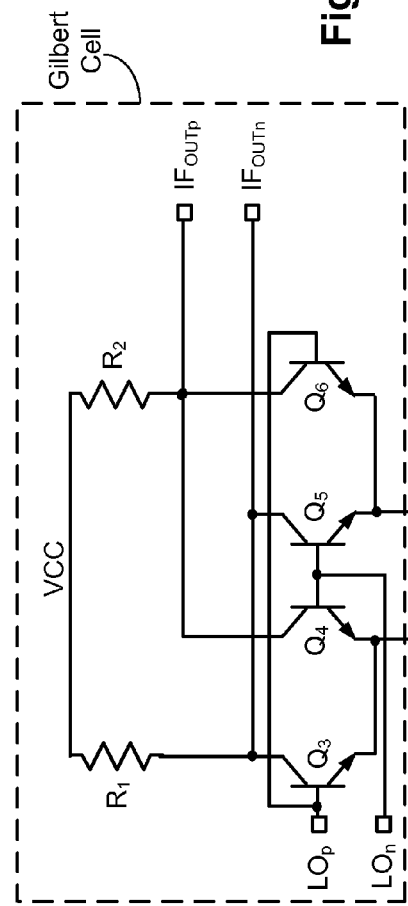
Figure 4B:
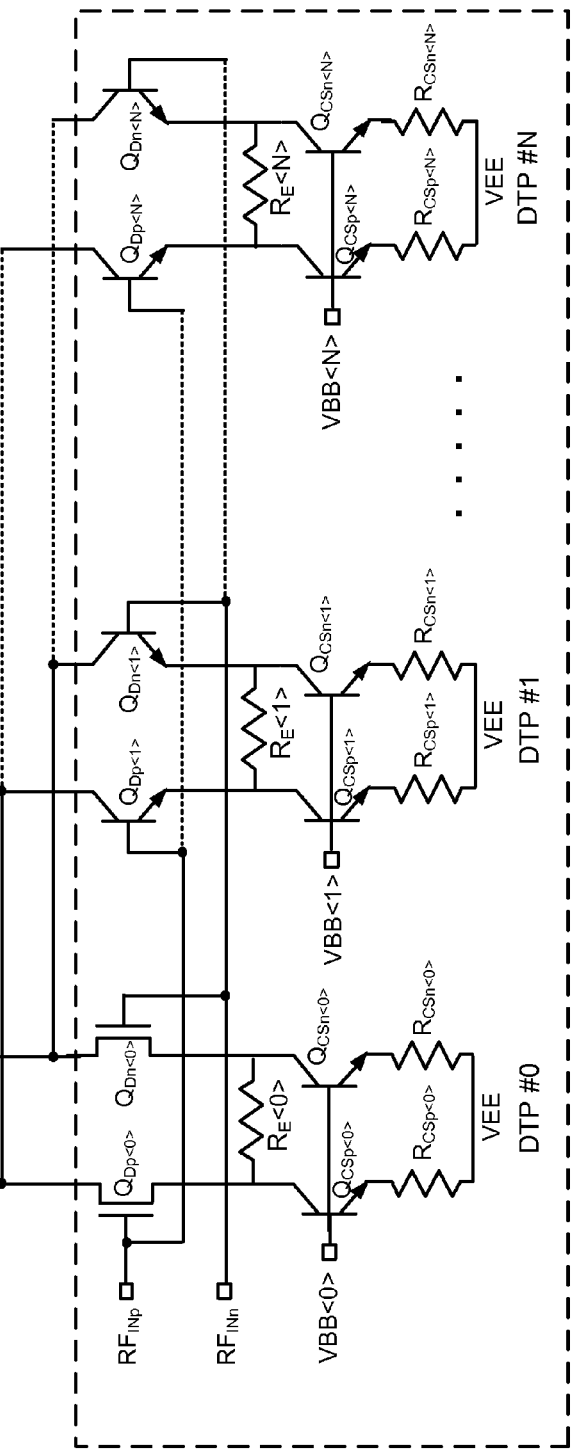

FIGS. 4a-b illustrates a switched gain Gilbert cell mixer circuit configured in accordance with another embodiment of the present invention. As can be seen, this example embodiment is similar to that discussed with reference to FIGS. 3a-b, except that in FIGS. 4a-b, one of the differential pairs ($Q_{Dp<0>}$ and $Q_{Dn<0>}$, in this example case) is implemented with a CMOS differential pair of field-effect transistors (FETs), as opposed to an HBT differential pair.

In general, using CMOS FETs, for example, instead of HBTs for the differential transconductance pairs ($Q_{Dp<n>}$ and $Q_{Dn<n>}$) allows for higher output intercept points and noise figures to be achieved when high-gain isn't required. Note that only one is shown in the example of FIG. 4b, but any number of the differential transconductance pairs ($Q_{Dp<n>}$ and $Q_{Dn<n>}$ where n can be any integer from 0 to N) can be implemented with CMOS process technology.

As previously explained, an advantage in summing the outputs of the differential transconductance pairs ($Q_{Dp<n>}$ and $Q_{Dn<n>}$), whether via collectors of heterojunction bipolar transistors $Q_{Dp<n>}$ and $Q_{Dn<n>}$ (such as shown in FIG. 3b) or the drains of CMOS transistors $Q_{Dp<0>}$ and $Q_{Dn<0>}$ (such as shown in FIG. 4b), is that low impedance current switching (rather than voltage switching) allows multiple inputs to be combined into a single node with little or no significant intermodulation product or noise figure degradation. Such a configuration gives the flexibility to reduce layout parasitics for simultaneous high speed, wideband, and high dynamic range applications, in accordance with an embodiment of the present invention.

Figure 5:
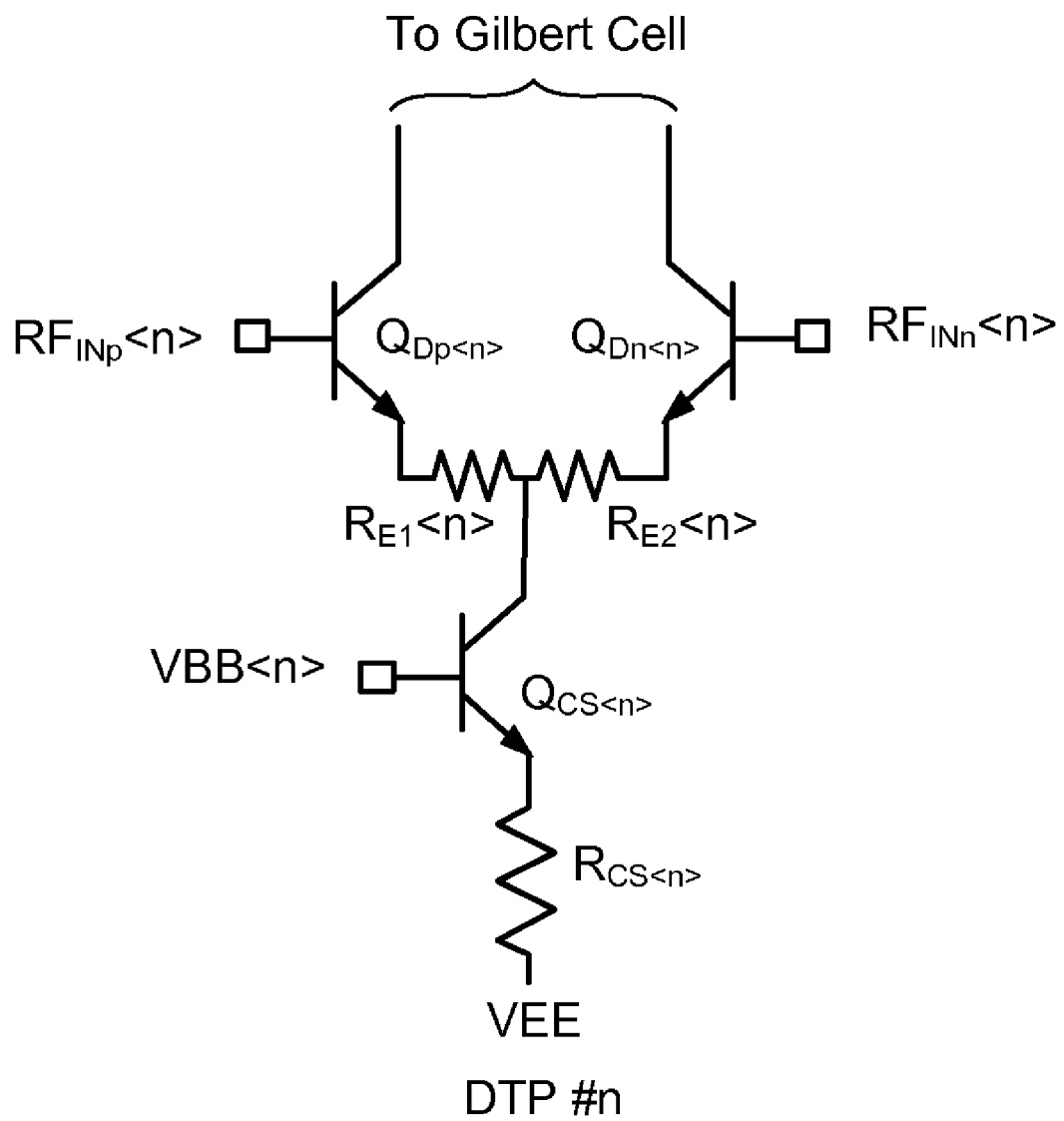
FIG. 5 illustrates an alternative differential transconductance pair that can be used in a multi-input/switched gain Gilbert cell mixer configured in accordance with another embodiment of the present invention.

FIG. 5 illustrates an alternative differential transconductance pair that can be used in a multi-input/switched gain Gilbert cell mixer configured in accordance with another embodiment of the present invention. As can be seen, this example DTP is implemented with a one tail current source, as opposed to the two tail current sources shown in other embodiments. As will be appreciated, note that n can be any integer from 0 to N, and may represent one of N+1 RF input signals or gain stages. As will further be appreciated, this one tail current source scheme can be substituted into any of the configurations shown in FIGS. 2a-b, 3a-b, and 4a-b, and the previous relevant discussion of those figures is equally applicable here.

The RF input/gain stage DTP #n includes a differential transconductance pair of transistors, $Q_{Dp<n>}$ and $Q_{Dn<n>}$, and is configured to receive a differential input voltage designated as $RF_{INp}<n>$ and $RF_{INn}<n>$. As previously explained, for a switched gain configuration, note that the same $RF_{INp}$ and $RF_{INn}$ can be applied to each of the N+1 stages. In any case, the transistor pair $Q_{Dp<n>}$ and $Q_{Dn<n>}$ converts the differential input voltage at its bases to an output current at its collectors. In operation, the differential pair $Q_{Dp<n>}$ and $Q_{Dn<n>}$ is turned on by raising or otherwise adjusting VBB<n> up to a proper voltage. When VBB<n> is applied, the transistor $Q_{CS<n>}$ and resistor $R_{CS<n>}$ source a current that biases $Q_{Dp<n>}$ and $Q_{Dn<n>}$ into the linear active region. As will be appreciated, VBB<n> can be adjusted to achieve a desired gain within that active region. If VBB<n> is too low, then the RF input/gain stage DTP #n will turn off; if VBB<n> is too high, then the RF input/gain stage DTP #n will saturate; thus, the active region is between these two extremes. The gain of RF input/gain stage DTP #n may also be adjusted, for example, by adjusting the degeneration impedance, which in this example is split into two serially connected resistors, $R_{E1}<n>$ and $R_{E2}<n>$, which can have the same value (e.g., 25 ohms each, or other suitable resistance depending on desired gain). The current source can be implemented, for example, as current mirrors with emitter degeneration, although other suitable current source configurations can be used as well.

System

Figure 6:
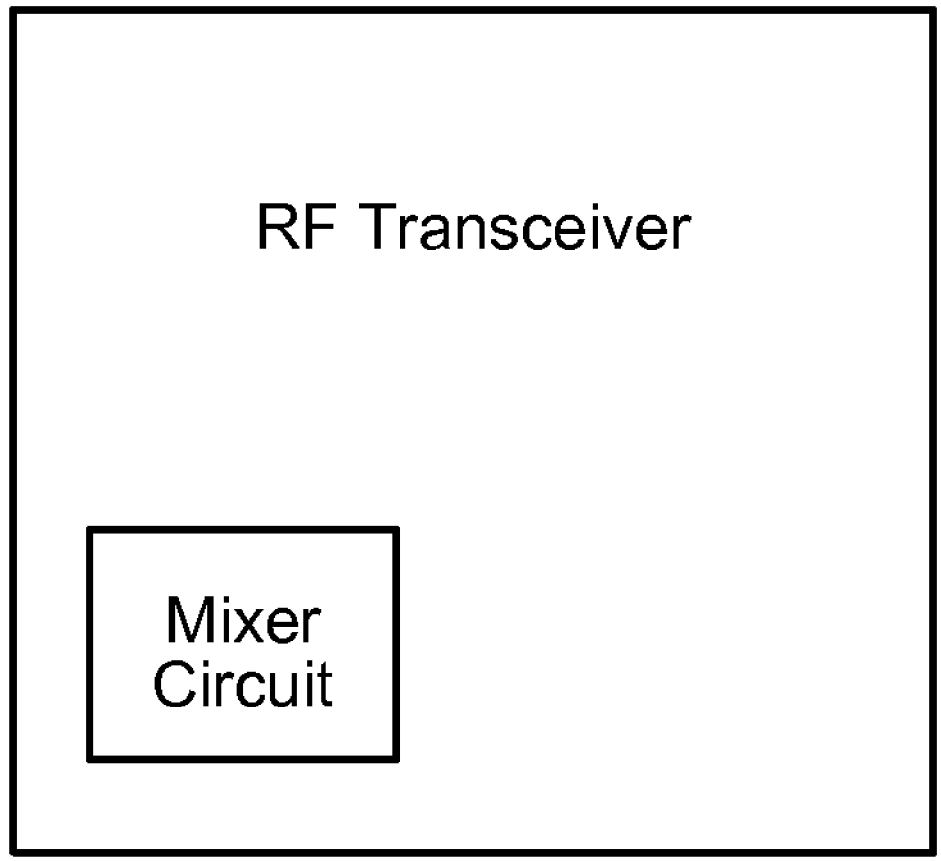
FIG. 6 is a transceiver system configured in accordance with an embodiment of the present invention.

FIG. 6 is a transceiver system configured in accordance with an embodiment of the present invention. As is known, a transceiver is configured with both a transmitter and a receiver that share common circuitry in a single housing (such as a transceiver on a chip). They are typically used in any number of communication applications (e.g., modems, radios, etc). In any case, the transceiver includes a mixer circuit, which can be implemented with a mixer architecture as described herein. In such applications, the mixer is generally used to convert the RF transmission band to IF band in receive direction, or from the IF band to the RF transmission band in the transmit direction. Other systems that can benefit from the mixer architecture will be apparent.

In one example configuration, the mixer circuit includes a Gilbert cell mixer stage and a plurality of input/gain stages. Each input/gain stage has its output connected to the input of the mixer stage (e.g., cascode connected), and is configured to receive an input signal and apply a gain factor (e.g., to provide unity gain, amplification, and/or attenuation) to that input signal to provide a signal for mixing with the LO. Each input/gain stage is further configured with stage select circuitry for enabling or disabling that stage, so that only one input/gain stage is active at a time. Thus, a multi-input Gilbert cell mixer is enabled, as is a multi-gain state Gilbert cell mixer.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A mixer circuit device comprising:
  a Gilbert cell mixer stage for multiplying a first signal received at an input by a second signal to provide an output signal; and
  a plurality of input/gain stages, each input/gain stage having its output connected to the input of the mixer stage and for receiving a differential input signal and applying a gain factor to that differential input signal to provide the first signal, wherein each input/gain stage is configured with stage select circuitry for enabling or disabling that stage, and wherein each of the input/gain stages includes a differential transistor pair for receiving said differential input signal and that is biased using the corresponding stage select circuitry, and the differential transistor pair of a first of the input/gain stages is implemented with a first transistor technology for providing the corresponding gain factor and the differential transistor pair of a second of the input/gain stages is implemented with a second transistor technology for providing the corresponding gain factor, the second transistor technology being different from the first transistor technology and wherein one of the first or second transistor technologies allows the mixer circuit to have higher output intercept points than the other of the first or second transistor technologies.

2. The device of claim 1 wherein each of the input/gain stages is configured with emitter degeneration and only one of the input/gain stages is enabled at a time.

3. The device of claim 1 wherein multi-gain stage functionality enabled by the device incurs a 10% or lower increase in noise figure degradation, relative to noise figure of a comparable single gain stage configuration.

4. The device of claim 1 wherein the first transistor technology is heterojunction bipolar transistor (HBT) technology, and the second transistor technology is complementary metal oxide semiconductor (CMOS) field effect transistor (FET) technology.

5. The device of claim 1 wherein each stage select circuitry includes a current source, and each of the current sources is implemented as a current mirror with emitter degeneration.

6. The device of claim 1 wherein each input/gain stage receives a corresponding one of multiple differential input signals.

7. The device of claim 1 wherein inputs of the input/gain stages are tied together so that each input/gain stage receives a common differential input signal.

8. The device of claim 1 wherein at least one of the input/gain stages has a different gain than others of the input/gain stages.

9. The device of claim 1 wherein the device is included in a system-on-chip configuration.

10. An integrated circuit comprising:
    a Gilbert cell mixer stage for multiplying a first signal received at an input by a second signal to provide an output signal; and
    a plurality of input/gain stages, each input/gain stage having its output connected to the input of the mixer stage and for receiving a differential input signal and applying a gain factor to that differential input signal to provide the first signal, wherein each input/gain stage is configured with stage select circuitry for enabling or disabling that stage;
    wherein the plurality of input/gain stages is implemented with at least two different transistor technologies, and each of the input/gain stages further includes a differential transistor pair for receiving said differential input signal and that is implemented with a corresponding one of the at least two different transistor technologies and biased using the corresponding stage select circuitry, and wherein one of the at least two different transistor technologies allows the integrated circuit to have higher output intercept points than the others of the at least two different transistor technologies.

11. The integrated circuit of claim 10 wherein at least one stage select circuitry is configured with a current source implemented as a current mirror with emitter degeneration.

12. The integrated circuit of claim 10 wherein the at least two different transistor technologies include bipolar junction transistor (BJT) technology, heterojunction bipolar transistor (HBT) technology, and/or complementary metal oxide semiconductor (CMOS) field effect transistor (FET) technology.

13. The integrated circuit of claim 10 wherein each input/gain stage receives a corresponding one of multiple differential input signals.

14. The integrated circuit of claim 10 wherein inputs of the input/gain stages are tied together so that each input/gain stage receives a common differential input signal.

15. The integrated circuit of claim 10 wherein at least one of the input/gain stages has a different gain than others of the input/gain stages.

16. A system comprising:
    a circuit for at least one of transmitting or receiving communication signals, the circuit including a mixer device, the mixer device comprising:
    a Gilbert cell mixer stage for multiplying a first signal received at an input by a second signal to provide an output signal; and
    a plurality of input/gain stages, each input/gain stage having its output connected to the input of the mixer stage and for receiving a differential input signal and applying a gain factor to that differential input signal to provide the first signal, wherein each input/gain stage is configured with stage select circuitry for enabling or disabling that stage;
    wherein the plurality of input/gain stages is implemented with at least two different transistor technologies, and each of the input/gain stages further includes a differential transistor pair for receiving said differential input signal and that is implemented with a corresponding one of the at least two different transistor technologies and biased using the corresponding stage select circuitry, and wherein one of the at least two different transistor technologies allows the circuit to have higher output intercept points than the others of the at least two different transistor technologies, and each stage select circuitry includes a current source.

17. The system of claim 16 wherein at least one of the current sources is implemented as a current mirror with emitter degeneration.

18. The system of claim 16 wherein each input/gain stage receives a corresponding one of multiple differential input signals.

19. The system of claim 16 wherein inputs of the input/gain stages are tied together so that each input/gain stage receives a common differential input signal.

20. The system of claim 16 wherein at least one of the input/gain stages has a different gain than others of the input/gain stages.

21. A mixer circuit device comprising:
    a Gilbert cell mixer stage for multiplying a first signal received at an input by a second signal to provide an output signal; and
    a plurality of input/gain stages, each input/gain stage having its output connected to the input of the mixer stage and for receiving a corresponding one of multiple differential input signals and applying a gain factor to that differential input signal to provide the first signal, wherein the plurality of input/gain stages is implemented with at least two different transistor technologies, and each input/gain stage is further configured with stage select circuitry for enabling or disabling that stage and a differential transistor pair for receiving its corresponding differential input signal and that is implemented with a corresponding one of the at least two different transistor technologies, and wherein one of the at least two different transistor technologies allows the mixer circuit to have higher output intercept points than the others of the at least two different transistor technologies.

22. The integrated circuit of claim 21 wherein at least one stage select circuitry is configured with a current source configured with emitter degeneration, and at least one of the input/gain stages has a different gain than others of the input/gain stages.

* * * * *